United States Patent
Dungan et al.

(10) Patent No.: US 9,653,586 B2
(45) Date of Patent: May 16, 2017

(54) AMPLIFIER DEVICE COMPRISING ENHANCED THERMAL TRANSFER AND STRUCTURAL FEATURES

(71) Applicant: Avago Technologies General IP (Singapore) Pte. Ltd., Singapore (SG)

(72) Inventors: Thomas Dungan, Fort Collins, CO (US); Forest Dixon, Timnath, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/838,939

(22) Filed: Aug. 28, 2015

(65) Prior Publication Data

US 2017/0062595 A1 Mar. 2, 2017

(51) Int. Cl.
*H01L 31/0328* (2006.01)
*H01L 31/0336* (2006.01)
*H01L 31/109* (2006.01)
*H01L 31/072* (2012.01)
*H01L 29/737* (2006.01)
*H01L 29/08* (2006.01)
(Continued)

(52) U.S. Cl.
CPC .......... *H01L 29/737* (2013.01); *H01L 23/367* (2013.01); *H01L 23/3736* (2013.01); *H01L 23/535* (2013.01); *H01L 29/0642* (2013.01); *H01L 29/0817* (2013.01); *H01L 29/0821* (2013.01); *H01L 29/1004* (2013.01); *H01L 29/41708* (2013.01)

(58) Field of Classification Search
CPC . H01L 29/737; H01L 23/535; H01L 23/3736; H01L 29/0642; H01L 29/0821; H01L 23/367
See application file for complete search history.

(56) References Cited

U.S. PATENT DOCUMENTS

| 6,600,179 B2 * | 7/2003 | Quaglietta .......... H01L 23/4821 257/197 |
| 8,344,504 B2 | 1/2013 | Wholey et al. |
| 8,994,075 B1 | 3/2015 | Moser et al. |

OTHER PUBLICATIONS

Mark J.W. Rodwell et al., "InP Bipolar ICs: Scaling Roadmaps, Frequency Limits, Manufacturable Technologies", Proceedings of the IEEE, Jun. 17, 2007, pp. 1-18.
(Continued)

*Primary Examiner* — Thomas L Dickey
*Assistant Examiner* — Damon Hilliman

(57) ABSTRACT

A heterojunction bipolar transistor (HBT) amplifier device includes transistor fingers arranged in parallel on a substrate. Each transistor finger includes a base/collector mesa stripe shaving a trapezoidal shaped cross-section with sloping sides, and having a base stacked on a collector; a set of emitter mesa stripes arranged on the base/collector mesa stripe; and emitter metallization formed over the set of emitter mesa stripes and the base/collector mesa. The emitter metallization includes a center portion for providing electrical and thermal connectivity to the emitter mesa stripes and extended portions extending beyond the base and overlapping onto the sloping sides of the base/collector mesa stripe for increasing thermal coupling to the collector. A common conductive pillar is formed over the transistor fingers for providing electrical and thermal conductivity. Also, thermal shunts are disposed on the substrate between adjacent transistor fingers, where the thermal shunts are electrically isolated from the transistor fingers.

20 Claims, 6 Drawing Sheets

(51) Int. Cl.
*H01L 29/10* (2006.01)
*H01L 23/367* (2006.01)
*H01L 23/373* (2006.01)
*H01L 23/535* (2006.01)
*H01L 29/06* (2006.01)
*H01L 29/417* (2006.01)

(56) References Cited

OTHER PUBLICATIONS

Hsiu-Chen Chang, "Device Characteristics Analysis of Gaas/Ingap HBT Power Cells Using Conventional Through Wafer Via Process and Copper Pillar Bump Process", CS MANTECH Conference, May 13-16, 2013, New Orleans, LA, pp. 153-156.

* cited by examiner

AMPLIFIER DEVICE COMPRISING ENHANCED THERMAL TRANSFER AND STRUCTURAL FEATURES

BACKGROUND

Packaging of semiconductor devices, such as wireless communication devices, has lead to the implementation of various techniques to effect electrical connections to the semiconductor devices, as well as thermal paths to dissipate heat. Heat dissipation, in particularly, is significant as specifications require devices to be more compact, resulting in the various electronic components, many of which generate heat during operation, occupying smaller spaces.

For example, a radio frequency (RF) power amplifier transistor needs to generate large-amplitude output signals while occupying a small physical volume, as a result of final product form factor constraints and/or manufacturing cost minimization. This results in very high power density. One exemplary implementation of such RF power amplifiers uses III-V heterojunction bipolar transistors (HBT) in a flip-chip configuration with copper pillars used to attach the RF power amplifier die to a module printed circuit board (PCB). The mismatches in thermal expansion coefficients of the different materials of such a device can produce significant undesirable physical stress. Such stress, in turn, may result in break-down and/or separation of layers and components within the device.

FIG. 1 shows a cross-sectional view of an example of a conventional amplifier device. Referring to FIG. 1, the amplifier device 100 includes multiple transistor fingers, indicated by representative transistor finger 110, arranged in parallel on a substrate 101, which may be formed of a semiconductor material. Each transistor finger 110 may be an HBT, for example. Although one transistor finger 110 is depicted in FIG. 1, it is understood that the other transistor fingers (not shown) of the amplifier device 100 have substantially the same configuration as the transistor finger 110.

The amplifier device 100 further includes first-level interconnects 131 and 132, a planarizing dielectric layer 140, a second-level interconnect 145, and a common conductive pillar 150. As indicated, there are two first-level interconnects, indicated by illustrative first-level interconnects 131 and 132, associated with each of the multiple transistor fingers 110 of the amplifier device 100. The second-level interconnect 145 and the conductive pillar 150 generally provide electrical and thermal conductivity with respect to the transistor finger 110. The amplifier device 100 also includes a planarizing dielectric layer 140, which fills the various spaces among the transistor finger 110, the first-level interconnects 131 and 132, and the second-level interconnect 145. The planarizing dielectric layer 140 also provides planarized surfaces on which the second-level interconnect 145 is formed.

The transistor finger 110 itself includes a base/collector mesa stripe 111, which includes a base 113 stacked on a collector 112 of the transistor finger 110. The collector 112 is disposed on a subcollector 114, which may be at least partially embedded in the substrate 101 and extends continuously beneath the stacked first-level interconnects 131 and 132 situated on opposite sides of the transistor finger 110, respectively, to the adjacent transistor fingers (not shown). Collector contacts 133 are disposed on the subcollector 114 beneath the stacked first-level interconnects 131 and 132. The subcollector 114 carries collector current to the collector contracts 133, providing electrical connection between the collector 112 and the stacked first-level interconnects 131 and 132, respectively. Base contacts 117 are disposed on a top surface of the base 113 to provide electrical connection to the base 113.

The transistor finger 110 further includes a set of emitter mesa stripes 121 and 122 arranged on the base/collector mesa stripe 111. Each of the emitter mesa stripes 121 and 122 comprises semiconductor emitter layers 124 stacked on a top surface of the base 113. The semiconductor emitter layers 124 are typically formed of ternary and/or quaternary semiconductor materials, for example. Emitter contacts 125 are stacked on the semiconductor emitter layers 124, respectively. Metal layers 126 are selectively disposed over emitter contacts 125 of the emitter mesa stripes 121 and 122, which provide traces for carrying electrical signals to and from the emitter mesa stripes 121 and 122, respectively.

Emitter metallization 123 is formed over the emitter mesa stripes 121 and 122, electrically and mechanically contacting the emitter contacts 125 of the emitter mesa stripes 121 and 122. Otherwise, the emitter metallization 123 is separated from the remaining portions of the emitter mesa stripes 121 and 122, as well as from the base/collector mesa stripe 111, by a conformal dielectric layer 115, electrically isolating the emitter metallization 123 from the remaining portions of the emitter mesa stripes 121 and 122, and from the base/collector mesa stripe 111. The emitter metallization 123 also directly contacts the second-level interconnect 145, which provides electrical and thermal connectivity between the set of emitter mesa stripes 111 and 112 of the transistor finger 110 and the conductive pillar 150.

Notably, the width (horizontal dimension) of the emitter metallization 123 is contained within (less than) the width of the top surface of the base 113 of the base/collector mesa stripe 111. That is, no portion of the emitter metallization 123 extends to (or beyond) the outer edges of the base/collector mesa stripe 111. Accordingly, heat generated during operation of the transistor finger 110 is dissipated generally upwardly, through the emitter metallization 123 to the second-level interconnect 145 and the conductive pillar 150.

More particularly, heat is generated primarily in regions 170 and 180 of the collector 112 in the base/collector mesa stripe 111, located beneath the emitter mesa stripes 121 and 122, respectively. From region 170, the generated heat dissipates through the emitter mesa stripe 121 and the emitter metallization 123 via thermal path 171, and around the emitter mesa stripe 121 and through the emitter metallization 123 via thermal paths 172 and 173. From region 180, the generated heat dissipates through the emitter mesa stripe 122 and the emitter metallization 123 via thermal path 181, and around the emitter mesa stripe 122 and through the emitter metallization 123 via thermal paths 182 and 183. This provides relatively few thermal paths for accommodating heat dissipation, particularly from an HBT (e.g., transistor finger 110), for example, confined in a compact amplifier device 100. Also, the ternary and/or quaternary materials of the semiconductor emitter layers 124 have relatively poor thermal conductivity, and the conformal dielectric 115 also typically has relatively poor thermal conductivity. This configuration therefore results in relatively high thermal resistance.

Accordingly, there is a need for semiconductor devices able to simultaneously manage thermal resistance and physical stress, while minimizing required physical volume and manufacturing cost.

BRIEF DESCRIPTION OF THE DRAWINGS

The present teachings are best understood from the following detailed description when read with the accompanying drawing figures. The features are not necessarily drawn to scale. Wherever practical, like reference numerals refer to like features.

DETAILED DESCRIPTION

In the following detailed description, for purposes of explanation and not limitation, representative embodiments disclosing specific details are set forth in order to provide a thorough understanding of the present teachings. Descriptions of known devices, materials and manufacturing methods may be omitted so as to avoid obscuring the description of the example embodiments. Nonetheless, such devices, materials and methods that are within the purview of one of ordinary skill in the art may be used in accordance with the representative embodiments.

Generally, representative embodiments of the disclosure provide an output stage of a power amplifier, such as a heterojunction bipolar transistor (HBT) amplifier, formed by parallel transistor fingers. Each of the transistor fingers includes one or more emitter mesa stripes arranged on a base/collector mesa stripe, with the emitter mesa stripes connected by emitter metallization to a shared or common copper pillar. The layer of emitter metallization connects with contacts of the emitter mesa stripes, but is separated from the base/collector mesa stripe by a dielectric material. Also, the layer of emitter metallization is formed such that it drapes over sloping sidewalls of the base/collector mesa stripe, so that the emitter metallization overlaps onto the collector layer of the base/collector mesa stripe. The increase in area of the emitter metallization also allows an increase in the area of the metal contact between the copper pillar and the emitter metallization.

In additional representative embodiments, stacks of metal extending from the (grounded) copper pillar to the semiconductor are provided between adjacent transistor fingers, e.g., over a portion of the semiconductor substrate rendered highly resistive by isolation implant. These stacks of metal, which may be referred to as thermal shunts, provide additional thermal paths from the collector layer (where power and thus heat is primarily dissipated), as well as mechanical anchors from the copper pillar to the semiconductor substrate to buffer the physical strain on the active devices, e.g., generated by thermal expansion and contraction.

Figure 2:
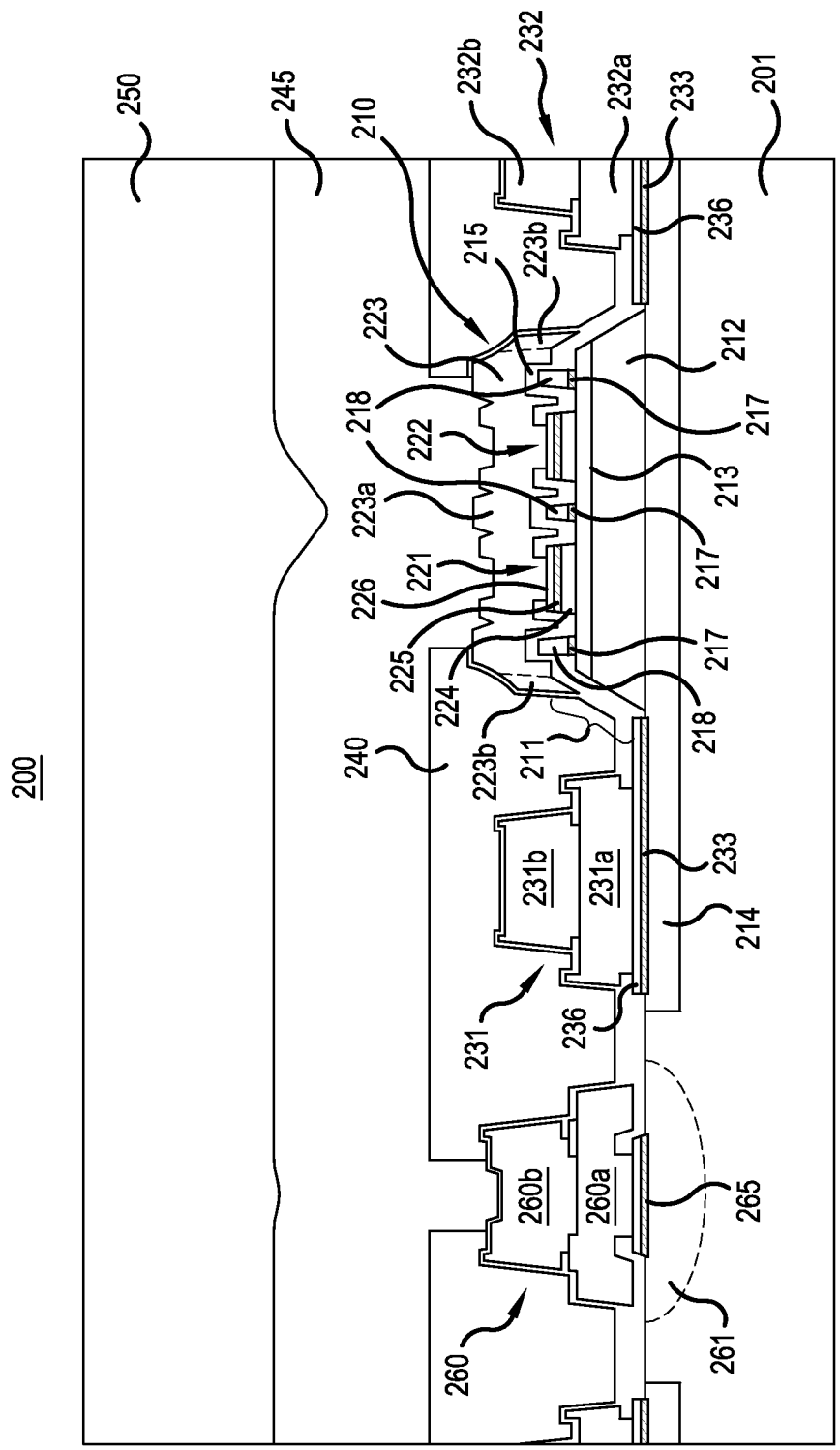
FIG. 2 shows a cross-sectional view of an amplifier device, in accordance with a representative embodiment.

FIG. 2 shows a cross-sectional view of an amplifier device in accordance with a representative embodiment. The amplifier device 200 includes multiple transistor fingers, indicated by representative transistor finger 210, arranged in parallel on a substrate 201, which may be formed of a semiconductor material, as discussed below. Each transistor finger 210 may be a heterojunction bipolar transistor (HBT), for example, in which case the amplifier device 200 is considered an HBT amplifier device. The amplifier device 200 further includes multiple thermal shunts, indicated by representative thermal shunt 260, arranged in parallel on the substrate 201 between adjacent transistor fingers 210. Although only one transistor finger 210 and one thermal shunt 260 are depicted in detail in FIG. 2, it is understood that the other transistor finger(s) and thermal shunt(s) (not shown) of the amplifier device 200 have substantially the same configuration as the transistor finger 210 and the thermal shunt 260, respectively.

The amplifier device 200 further includes first-level interconnects 231 and 232, planarizing dielectric layer 240, a second-level interconnect 245, and a common conductive pillar 250. As indicated, there are two first-level interconnects, indicated by illustrative first-level interconnects 231 and 232, associated with each of the multiple transistor fingers 210 of the amplifier device 200. Each of the first-level interconnects 231 and 232 is not grounded, and is configured to carry electrical current away from the transistor finger 210 via the subcollector 214 and a corresponding collector contact 233. In the depicted embodiment, the first-level interconnect 231 includes stacked layers, layers 231a and 231b disposed the collector base 233, and the first-level interconnect 232 includes stacked layers 232a and 232b disposed on the collector base 233. In alternative embodiments, the first-level interconnects 231 and 232 may be formed of a different number of layers, such as a single layer solid block, or more than two stacked layers, without departing from the scope of the present teachings. The collector contacts 233 are formed of a thin layer of collector metal (the same material as the collector 212, such as gold (Au) or germanium (Ge), for example. The first-level interconnects 231 and 232 may be formed of various conductive materials, such as gold (Au), copper (Cu) or aluminum (Al), for example. Also, in the depicted embodiment, the stacked layers 231a and 232a may be formed during application of emitter metallization 223.

The second-level interconnect 245 and the conductive pillar 250 may be formed of copper (Cu) or plated copper, for example, and generally provide electrical and thermal conductivity with respect to the transistor finger 210. Alternative electrically and thermally conductive materials are contemplated for use as the conductive pillar 250, such as silver (Ag) or a solder material such as tin (Sn), or one or more of such alternative materials may be applied to a copper or plated copper conductive pillar 250. For example, the conductive pillar 250 may be formed of plated copper (Cu) followed by a layer of silver (Ag) or solder. The conductive pillar 250 is grounded. Also, in various embodiments (e.g., such as use as an RF power amplifier), the amplifier device 200 may be implemented in a flip-chip configuration, such that the copper pillar 250 is used to attach the amplifier device 200 die to a module printed circuit board (PCB), for example. Additional description of illustrative conductive pillars is provided by Wholey et al., in U.S. Pat. No. 8,344,504 (issued Jan. 1, 2013), which is hereby incorporated by reference in its entirety.

The amplifier device 200 also includes a planarizing dielectric layer 240. The planarizing dielectric layer 240 fills the various spaces among the transistor finger 210, the stacked first-level interconnects 231 and 232, the thermal shunt 260, and the second-level interconnect 245, thereby reinforcing physical separation and providing electrical isolation among the various components, where needed. The planarizing dielectric layer 240 also provides planarized surfaces on which the second-level interconnect 245 is formed. In an embodiment, the second-level interconnected 245 may be omitted, in which case the planarizing dielectric layer 240 provides planarized surfaces on which the conductive pillar 250 is formed. The planarizing dielectric layer 240 may be formed of low-k dielectric material(s) compatible with semiconductor materials and processes, such as silicon dioxide ($SiO_2$), silicon nitride ($Si_3N_4$), aluminum nitride (AlN) or an oxynitride (e.g., aluminum oxynitride), for example. Alternatively, the dielectric layer 240 may comprise a known spun-on dielectric material, such as BCB or polyimide, or a combination of BCB or polyimide and silicon oxide, silicon nitride or silicon oxynitride.

In the depicted embodiment, the transistor finger 210 includes a base/collector mesa stripe 211, which has a trapezoidal shaped cross-section with sloping sides. The trapezoidal shape of the base/collector mesa stripe 211 may be obtained by a wet etching process, rather than a typical plasma dry etch, for example, which would produce a more rectangular cross-section. The base/collector mesa stripe 211 includes a base 213 stacked on a collector 212 of the transistor finger 210. The collector 212 is disposed on a subcollector 214, which may be at least partially embedded in the substrate 201 and extends beneath the stacked first-level interconnects 231 and 232 situated on opposite sides of the transistor finger 210, respectively, for carrying current laterally from the base/mesa collector stripe 211 to the collector contacts 233. The first-level interconnects 231 and 232 disposed on the collector contacts 233 are thereby electrically connected to the collector 212, as discussed above. Base contacts 217 are disposed on the base 213 to provide electrical connection to the base 213. The collector contacts 233 and the base contacts 217 may be formed of layers including gold (Au), for example, by known methods. Metal layers 236 are selectively disposed over the collector contacts 233, respectively, and metal layers 218 are selectively disposed over the base contacts 217 of the base 213 where the metal layers 236 and 218 provide traces for carrying electrical signals to and from the collector 212 and the base 213 of the transistor finger 210, respectively. Illustratively, the metal layers are formed of gold (Au), for example, by known processes, although other conductive materials, such as aluminum (Al) and/or copper (Cu) may be incorporated.

The transistor finger 210 further includes a set of emitter mesa stripes 221 and 222 arranged on the base/collector mesa stripe 211. Each of the emitter mesa stripes 221 and 222 comprises multiple emitter layers stacked on a top surface of the base 213. More particularly, each of the emitter mesa stripes 221, 222 includes one or more semiconductor layers 224 (e.g., formed of ternary or quaternary compounds), an emitter contact 225 on top of the semiconductor layers 224, and a metal layer 226 on top of the emitter contact 225 to provide traces for carrying electrical signals to and from the emitter mesa stripes 221 and 222. Notably, although the emitter mesa stripes 221, 222 are shown as having substantially rectangular cross-sections, it is understood that other cross-sectional shapes may be implemented without departing from the scope of the present teachings. Likewise, although a set of two emitter mesa stripes 221, 222 are shown, it is understood that one emitter mesa stripe or more than two emitter mesa stripes may be implemented without departing from the scope of the present teachings. Illustratively, the semiconductor layers 224 may be formed of ternary or quaternary compounds, the emitter contacts 225 may be formed of gold (Au), and the metal layers may be formed of gold (Au), for example, by known processes, although other conductive materials, such as aluminum (Al) and/or copper (Cu) may be incorporated.

Emitter metallization 223 is formed over the emitter mesa stripes 221 and 222 and over the base/collector mesa stripe 211, electrically and mechanically contacting the emitter contacts 225 of the emitter mesa stripes 221 and 222. The emitter metallization 223 is otherwise separated from the remaining portions of the emitter mesa stripes 221 an 222, as well as from the base/collector mesa stripe 211, by a conformal dielectric layer 215, electrically isolating the emitter metallization 223 from the remaining portions of the emitter mesa stripes 221 and 222, and from the base/collector mesa stripe 211. The conformal dielectric layer 215 may be formed of any dielectric material(s) compatible with semiconductor materials and processes, such as silicon dioxide ($SiO_2$), silicon nitride ($Si_3N_4$), aluminum nitride (AlN) or an oxynitride (e.g., aluminum oxynitride), for example. The emitter metallization 223 also directly contacts the second-level interconnect 245, which provides electrical and thermal connectivity between the set of emitter mesa stripes 211 and 212 of the transistor finger 210 and the conductive pillar 250.

The emitter metallization 223 includes a center portion 223a, having approximately the same width as the top surface of the base 213, and an extended portion 223b, extending beyond the top surface of the base 213 and overlapping onto the sloping sides of the base/collector mesa stripe 211. For example, the extended portion 223b of the emitter metallization 223 extends down to a level of the collector 212 in the base/collector mesa stripe 211, so that the extended portion 223b overlaps the outer edges of the collector 212.

The center portion 223a of the emitter metallization 223 generally provides electrical and thermal connectivity to the emitter mesa stripes 221 and 222, while the extended portion 223b generally increases thermal coupling to the collector 212. That is, by overlapping onto the sloped sides of the base/collector mesa stripe 211, the extended portion 223b of the emitter metallization 223 increases thermal coupling between the emitter metallization 223 and the collector 212, as discussed further below with reference to FIG. 3.

In addition, the presence of the extended portion 223b enables an increased area of metal contact between the emitter metallization 223 (e.g., center portion 223a) and the second-level interconnect 245. Or, in an embodiment in which there is no second-level interconnect 245, the extended portion 223b enables an increased area of metal contact between the emitter metallization 223 (e.g., center portion 223a) and the conductive pillar 250. In either configuration, there is an area of increased contact, indirectly or directly, with the conductive pillar 250. Accordingly, the larger center portion 223 and the presences of the extended portion 223b enhance heat dissipation, as well as provide additional mechanical support between the conductive pillar 250 and the substrate 201.

Generally, the thermal shunts (e.g., thermal shunt 260) are metal connections between the grounded conductive pillar 250 and the substrate 201 via collector metal. More particularly, the illustrative thermal shunt 260 is disposed on a thin layer 265 of collector metal over an isolation implant region 261 of the substrate 201 between the transistor finger 210 and an adjacent transistor finger (not shown). The isolation implant region 261 is implanted with material that renders the corresponding portion of the substrate 201 highly electrically resistive, resulting in the thermal shunt 260 to be electrically isolated from the transistor finger 210 (as well as any other HBTs on the substrate 201), while providing low thermal resistance. That is, the material renders a portion of the substrate 201 non-conductive electrically, preventing the thermal shunt 260 from shorting the subcollector 214, for example. Examples of the implanted material in the isolation implant region 261 include hydrogen (H), boron (B) and oxygen (O), for example.

The thermal shunt 260 (as well as the other thermal shunts) is configured to provide an additional thermal path from the collector 212 in the base/collector mesa stripe 211 to the common conductive pillar 250, as discussed further below with reference to FIG. 3. The thermal shunt 260 (as well as the other thermal shunts) is also configured to provide a mechanical anchor between the conductive pillar 250 and the substrate 201. Unlike the first-level interconnects 231 and 232, discussed above, the thermal shunt 260 directly connects with the second-level interconnect 245 to accommodate enhanced heat dissipation, as well as enhanced physical strength. Notably, the planarizing dielectric layer 240, being formed of low-k dielectric material, does not possess much physical strength, further underscoring the mechanical advantages of the conductive pillar 250. Therefore, the second-level interconnect 245 provides thermal connectivity between the thermal shunt 260 and the conductive pillar 250.

In an embodiment, the thermal shunt 260 includes two stacked layers: layers 260a and 260b. Each of the layers 260a and 260b may be formed of materials having no inorganic conformal dielectrics, such as silicon nitride (SiN), and no ternary or more complex alloys, the absence of which enables enhanced thermal conductivity. Examples of such materials include gold (Au), copper (Cu) and aluminum (Al), although other metals may be incorporated without departing from the scope of the present teachings. Further, although two stacked layers 260a and 260b are shown, the thermal shunt 260 may be formed of a different number of layers, such as a single layer solid block, or more than two stacked layers, without departing from the scope of the present teachings, so long as an uninterrupted metal path is provided between the conductive pillar 250 and the substrate 201. As mentioned above, the thin layer 265 of collector metal is formed between the layer 260a and the isolation implant region 261. The thin layer 265 is present as a practical matter because the collector metal (e.g., also forming collector contacts 233) is the only metal deposited directly on the semiconductor 201 during fabrication of the illustrative amplifier device 200, thereby enabling the uninterrupted metal path between the conductive pillar 250 and the substrate 201.

Notably, the pitch between the adjacent transistor fingers (e.g., the transistor finger 210 and the next parallel transistor finger) of the amplifier device 200 is increased as compared to the pitch between adjacent transistor fingers of conventional amplifier devices, such as amplifier device 100. The increased pitch provides additional space to accommodate the thermal shunts (e.g., thermal shunt 260) disposed between the adjacent transistor fingers (e.g., transistor finger 210). Also, the length of each transistor finger may be increased as compared to the length of conventional transistor fingers to compensate for the wider pitch (which may result in fewer, but longer, transistor fingers in the amplifier device 200). In an embodiment, the length of each transistor finger and the pitch between transistor fingers may be about twice those of a comparable conventional amplifier device, respectively, although the disclosure is not limited to this ratio. For example, the length of each transistor finger may be about 100 µm and the pitch between adjacent transistor fingers may be about 46 µm in the illustrative amplifier device 200, according to a representative embodiment, while the length of each transistor finger may be about 50 µm and the pitch between adjacent transistor fingers may be about 23 µm in a comparable conventional amplifier device 100.

Figure 3:
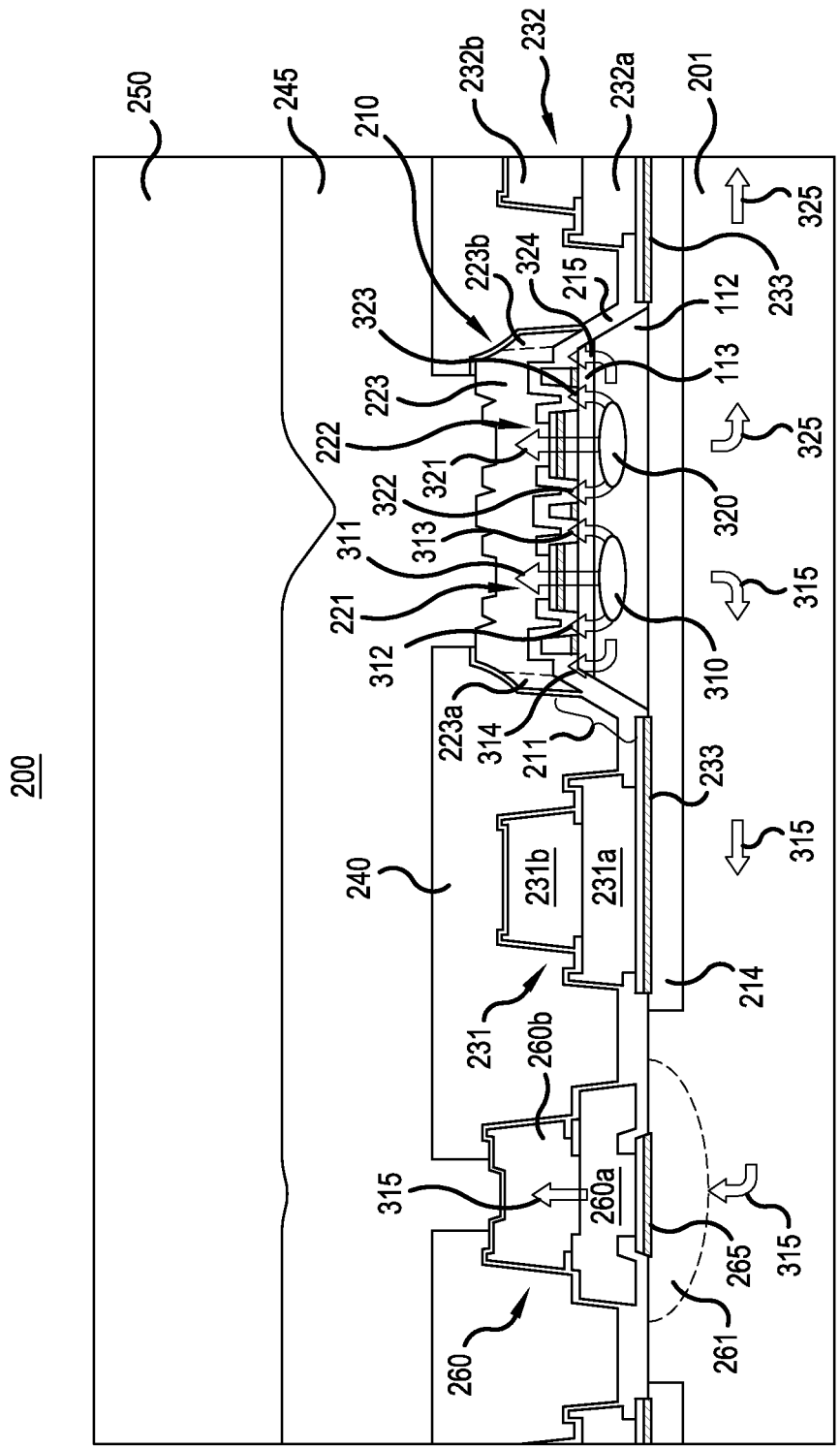
FIG. 3 shows a cross-sectional view of an amplifier device and corresponding heat dissipation characteristics, in accordance with a representative embodiment.

FIG. 3 shows a cross-sectional view of the amplifier device of FIG. 2, including indication of various thermal paths, in accordance with a representative embodiment. Referring to FIG. 3, heat is generated primarily in regions 310 and 320 in the collector 212 of the base/collector mesa stripe 211, located beneath the emitter mesa stripes 221 and 222, respectively. From region 310, the generated heat dissipates through the emitter mesa stripe 221 and the emitter metallization 223 via thermal path 311, around the emitter mesa stripe 221 and through the emitter metallization 223 via thermal paths 312 and 313, and through the collector 212, the base 213 and the extended portion 223b of the emitter metallization 223 via thermal path 314. The thermal path 314 is effectively a first augmented thermal path enabled by the presence of the extended portion 223b. From region 320, the generated heat dissipates through the emitter mesa stripe 222 and the emitter metallization 223 via thermal path 321, around the emitter mesa stripe 222 and through the emitter metallization 223 via thermal paths 322 and 323, and through the collector 212, the base 213 and the extended portion 223b of the emitter metallization 223 via thermal path 324. The thermal path 324 is effectively a second augmented thermal path enabled by the presence of the extended portion 223b.

The heat generated in regions 310 and 320 is also dissipated at least in part through the substrate 201 via thermal paths 315 and 325 (each indicated by multiple arrows), respectively. As shown by the thermal path 315, in particular, the dissipated heat passes through the substrate 201 and the thermal shunt 260 (i.e., a third augmented thermal path enabled by the presence of the thermal shunt 260). It is understood that the thermal path 325 also passes through the substrate 201 and a thermal shunt (not shown in FIG. 3) on the opposite side of the transistor finger 210 (i.e., a fourth augmented path).

For purposes of illustration, the substrate 201 comprises GaAs, and the transistor finger 210 (active semiconductor device) is an HBT, e.g., of the type that may be used for an RF power amplifier output stage. The substrate 201 may be formed of other semiconductor materials, such as indium phosphide (InP), binary semiconductor materials (e.g., Group III-IV and Group IV-VI semiconductor materials), ternary semiconductor materials, silicon (Si) and silicon-germanium (SiGe). Moreover, the present teachings contemplate the use of synthetic diamond for the substrate 201 fabricated by a known chemical vapor deposition (CVD) method, for example.

As should be appreciated, the type of active device and the material for the substrate 201 dictates the processing techniques and materials selected for fabricating the active device and other components of the amplifier device 200. As mentioned above, for purposes of illustration, the substrate 201 comprises GaAs, and the active device comprises HBT, e.g., of the type that may be used for an RF power amplifier output stage. Such techniques and materials are within the purview of one of ordinary skill in the art of semiconductor processing and are generally not detailed herein to avoid obscuring the description of the representative embodiments.

It is understood that the selection of GaAs for the substrate 201 and the selection of the HBT as the active device are illustrative, and other substrate materials and active devices are contemplated, particularly active devices that require heat dissipation, without departing from the scope of the present teachings. For example, the active device may be a pseudomorphic high electron mobility transistor (pHEMT), or an enhanced pseudomorphic high electron mobility transistor (E-pHEMT). Alternatively, the substrate may comprise silicon and the active device may comprise a metal oxide semiconductor (MOS) device such as a MOS field effect transistor (MOSFET) or complementary MOS (CMOS) device. Additionally, a combination of a plurality of the different active devices may be provided over the substrate 201 to provide a desired circuit.

It is noted that the amplifier device 200 may comprise passive electrical components (not shown) formed in or over the substrate 201 and in addition to active semiconductor devices referenced above. The combination of active semiconductor devices and passive electrical components provides electrical circuits of the amplifier device 200. Passive electrical components include for example, resistors, capacitors, signal transmission lines (transmission lines), and inductors. These passive electrical components may be selectively electrically connected to the active semiconductor device(s) to provide a desired circuit. The passive electrical components may be fabricated using known methods and materials. Notably, the various current-carrying traces of the semiconductor structure 200 can function as transmission lines and inductors.

Figure 1:
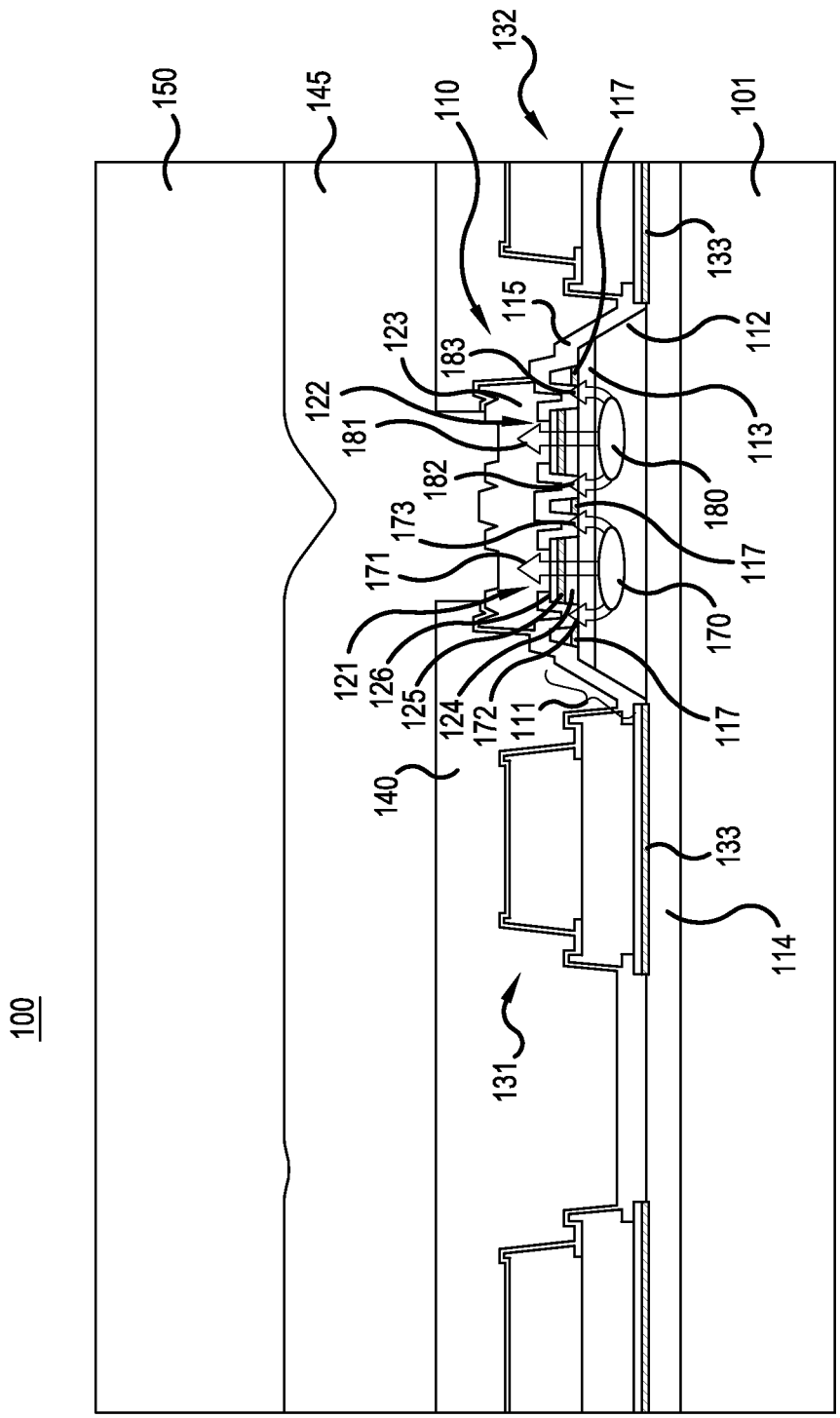
FIG. 1 shows a cross-sectional view of a conventional amplifier device structure and corresponding heat dissipation characteristics.
Figure 4:
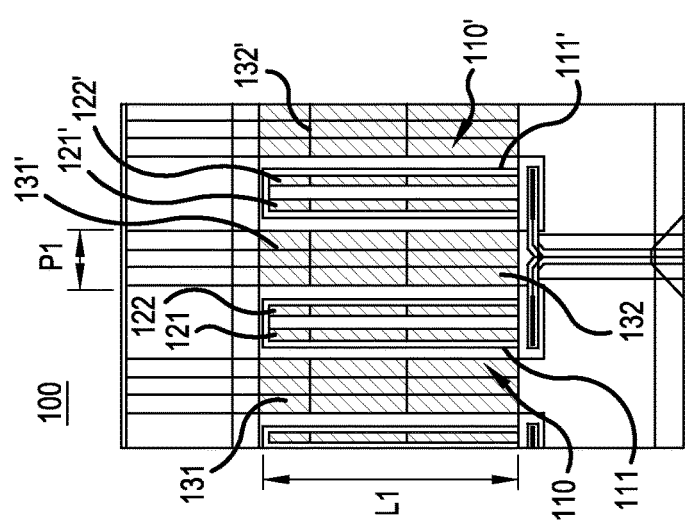
FIG. 4 shows a top cut-away view of a conventional amplifier device in an interim fabrication stage, following application of contact metal on emitters.

FIG. 4 shows a top cut-away view of a conventional amplifier device (e.g., amplifier device 100) in an interim fabrication stage, following application of contact metal on emitter mesa stripes. In particular, referring to FIGS. 1 and 4, representative transistor fingers 110, 110' are shown with corresponding emitter mesa stripes 121, 122 and 121', 122' on base/collector mesa stripes 111, 111', respectively. The emitter mesa stripes 121, 122, 121' and 122' are shown after application of contact metal (but before application of emitter metallization 123). FIG. 4 also shows first-level interconnects 131, 132 and 131', 132', which are shared between adjacent transistor fingers 110, 110'. For purposes of illustration, length L1 of each transistor finger 110, 110' is about 50 μm and pitch P1 between the adjacent transistor fingers 110, 110' is about 23 μm, for example.

Figure 5:
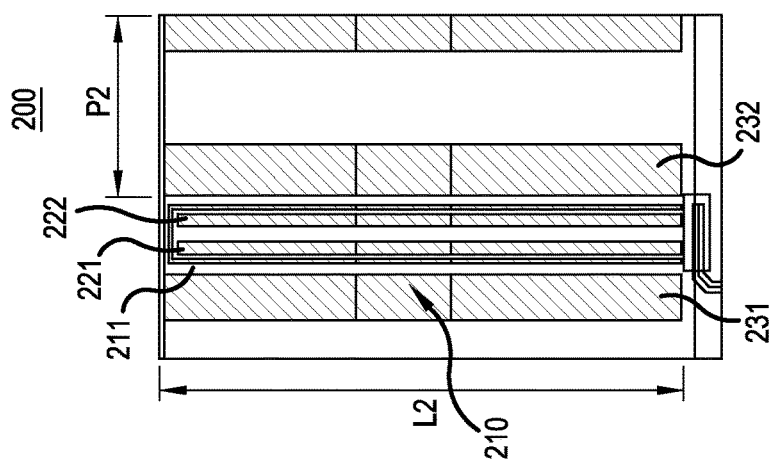
FIG. 5 shows a cut-away view of an amplifier device in an interim fabrication stage, following application of contact metal on emitters, in accordance with a representative embodiment.

FIG. 5 shows a cut-away view of an amplifier device (e.g., amplifier device 200) in an interim fabrication stage, following application of contact metal on emitters, in accordance with a representative embodiment. In particular, referring to FIGS. 2 and 5, representative transistor finger 210 is shown with corresponding emitter mesa stripes 221, 222 on base/collector mesa stripe 211. The emitter mesa stripes 221 and 222 are shown after application of contact metal (but before application of emitter metallization 223). FIG. 5 also shows first-level interconnects 231, 232 positioned on either side of the transistor finger 210. For purposes of illustration, length L2 (e.g., about 100 μm) of the transistor finger 210 is longer than the length L1, and pitch P2 (e.g., about 46 μm) between the adjacent transistor fingers 210 is greater than the pitch P1, as discussed above. Of course, the length L2 and the pitch P2 may vary to provide unique benefits for any particular situation or to meet application specific design requirements of various implementations, as would be apparent to one skilled in the art. Notably, the greater pitch P2 creates a space large enough to accommodate placement a thermal shunt, such as thermal shunt 260, as discussed below.

Figure 6:
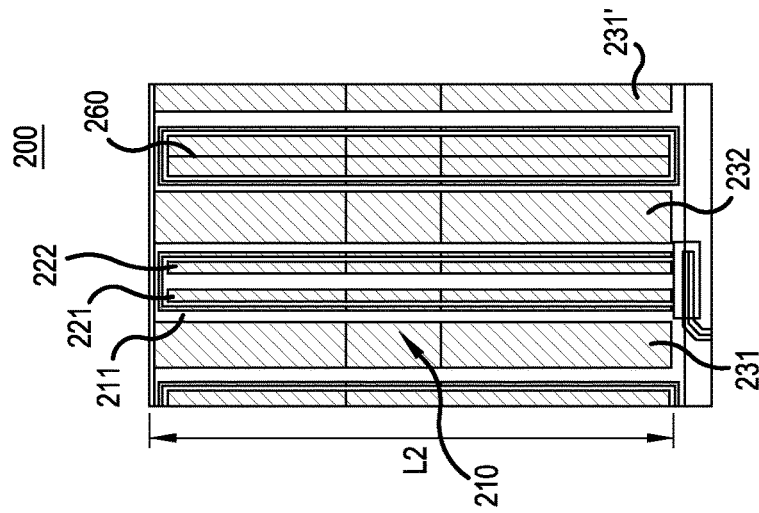
FIG. 6 shows a cut-away view of an amplifier device in an interim fabrication stage, following application of contact metal on emitters and addition of thermal shunts, in accordance with a representative embodiment.

FIG. 6 shows a cut-away view of the amplifier device shown in FIG. 5 in a subsequent interim fabrication stage, following application of contact metal on emitters and addition of thermal shunts, in accordance with a representative embodiment. Referring to FIGS. 2 and 6, representative transistor finger 210 is shown with corresponding emitter mesa stripes 221, 222 on base/collector mesa stripe 211. The emitter mesa stripes 221 and 222 are shown after application of contact metal (but before application of emitter metallization 223). FIG. 6 also shows first-level interconnects 231, 232 positioned on either side of the transistor finger 210. The thermal shunt 260 is shown added to the space made available by the greater pitch P2, between the first-level interconnect 232 and another first-level interconnect 231' of the adjacent transistor finger (not shown).

Figure 7:
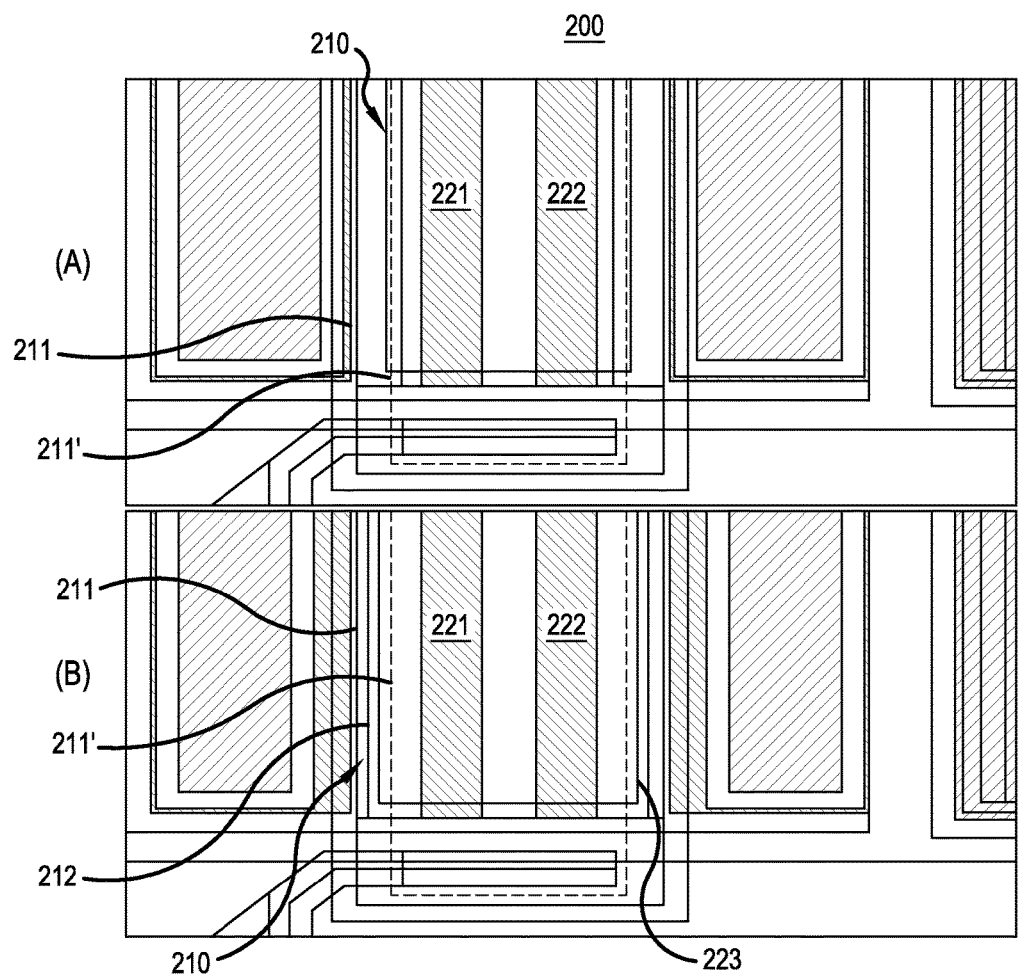
FIGS. 7(A) and 7(B) shows cut-away views of an amplifier device in interim fabrication stages, before and after application of emitter metallization, in accordance with a representative embodiment.
Figure 7A:
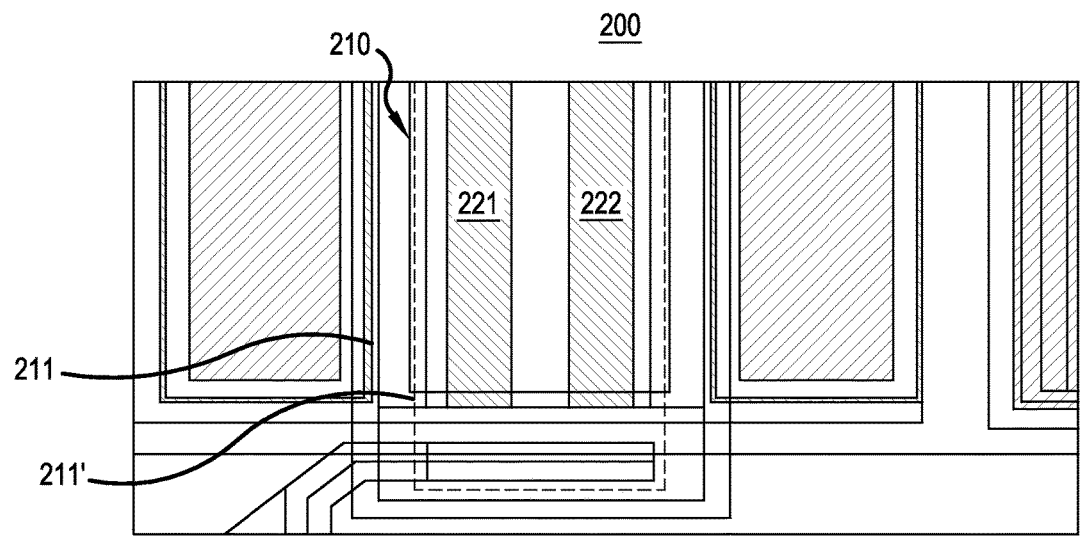
Figure 7B:
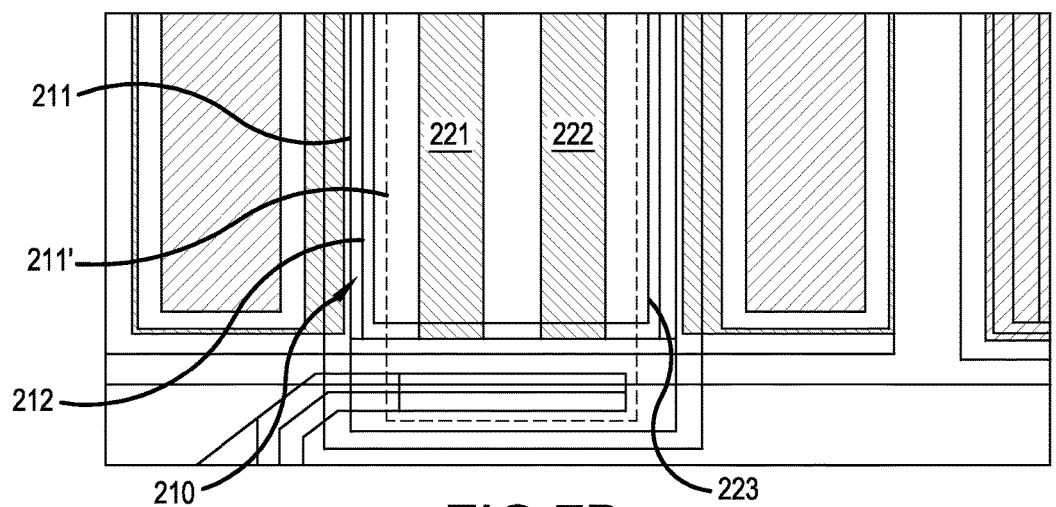

FIGS. 7(A) and 7(B) show cut-away views of an amplifier device in interim fabrication stages, before and after application of emitter metallization, respectively, in accordance with a representative embodiment. Referring to FIGS. 2, 7(A) and 7(B), representative transistor finger 210 is shown with corresponding emitter mesa stripes 221, 222 on base/collector mesa stripe 211. In FIG. 7(A), the emitter mesa stripes 221 and 222 are shown after application of contact metal (but before application of emitter metallization 223). In comparison, in FIG. 7(B), the emitter mesa stripes 221 and 222 are shown after application of the emitter metallization 223. The dashed line 211' shows the outer boundary of the top surface of the base/collector mesa stripe 211 (which corresponds to the outer boundary of the base 213). As shown in FIG. 7(B), the emitter metallization 223 extends beyond the dashed line 211', indicating that the emitter metallization 223 extends beyond the top surface of the mesa stripe 211 and overlaps onto the sloping sides of the base/collector mesa stripe 211 onto the collector 212.

In view of this disclosure it is noted that the various semiconductor structures and active semiconductor devices can be implemented in a variety of materials and variant structures. Further, the various materials, structures and parameters are included by way of example only and not in any limiting sense. In view of this disclosure, those skilled in the art can implement the present teachings in determining their own applications and needed materials and equipment to implement these applications, while remaining within the scope of the appended claims.

What is claimed:

1. A heterojunction bipolar transistor (HBT) amplifier device, comprising:
    a plurality of transistor fingers arranged in parallel on a substrate, each transistor finger comprising:
        a base/collector mesa stripe having a trapezoidal shaped cross-section with sloping sides, the base/collector mesa stripe comprising a base stacked on a collector of the transistor finger;
        a set of emitter mesa stripes arranged on the base/collector mesa stripe; and
        emitter metallization formed over the set of emitter mesa stripes and the base/collector mesa stripe, the emitter metallization comprising (i) a center portion for providing electrical and thermal connectivity to the set of emitter mesa stripes and (ii) extended portions extending beyond the base and overlapping onto the sloping sides of the base/collector mesa stripe for increasing thermal coupling to the collector; and a common conductive pillar formed over the plurality of transistor fingers for providing electrical and thermal conductivity, including electrical and thermal conductivity through a top surface of the emitter metallization of each of the plurality of transistor fingers.

2. The HBT amplifier device of claim 1, further comprising:
a plurality of thermal shunts disposed on the substrate between adjacent transistor fingers of the plurality of transistor fingers, the plurality of thermal shunts being electrically isolated from the plurality of transistor fingers.

3. The HBT amplifier device of claim 2, wherein the plurality of thermal shunts are configured to provide additional thermal paths from collectors of the plurality of transistor fingers to the common conductive pillar, and to provide mechanical anchors between the common conductive pillar and the substrate.

4. The HBT amplifier device of claim 2, further comprising:
a plated second-level interconnect configured to provide electrical and thermal connectivity between the set of emitter mesa stripes of each transistor finger and the common conductive pillar, and to provide thermal connectivity between the plurality of thermal shunts and the common conductive pillar.

5. The HBT amplifier device of claim 4, further comprising:
a planarizing dielectric material between the substrate and the plated second-level interconnect.

6. The HBT amplifier device of claim 2, wherein the plurality of thermal shunts are formed with no nitrides and no ternary or quaternary alloys, enabling enhanced thermal conductivity.

7. The HBT amplifier device of claim 1, wherein the extended portions of the emitter metallization in each transistor finger extend down to a level of the corresponding collector in the base/collector mesa stripe, so that it overlaps onto a collector layer.

8. The HBT amplifier device of claim 3, wherein the plurality of thermal shunts are formed on thin layers of collector metal arranged on corresponding isolation implant regions of the substrate.

9. The HBT amplifier device of claim 1, wherein the common conductive pillar is formed of plated copper.

10. The HBT amplifier device of claim 2, wherein a pitch between the adjacent transistor fingers is increased to accommodate each thermal shunt disposed between the adjacent transistor fingers.

11. The HBT amplifier device of claim 1, wherein the center portion and the extended portions of the emitter metallization are configured to enhance mechanical support between the common conductive pillar and the substrate.

12. A heterojunction bipolar transistor (HBT) amplifier device, comprising:
a plurality of transistor fingers arranged in parallel on a substrate, each transistor finger comprising:
a base/collector mesa stripe having a trapezoidal shaped cross-section with sloping sides, the base/collector mesa stripe comprising a base stacked on a collector of the transistor finger;
a set of emitter mesa stripes arranged on the base/collector mesa stripe; and
emitter metallization formed over the set of emitter mesa stripes and the base/collector mesa stripe, the emitter metallization comprising (i) a center portion for providing electrical and thermal connectivity to the set of emitter mesa stripes and (ii) extended portions extending beyond the base and overlapping onto the sloping sides of the base/collector mesa stripe for increasing thermal coupling to the collector; and
a common conductive pillar formed over the plurality of transistor fingers for providing electrical and thermal conductivity,
wherein the extended portions of the emitter metallization in each transistor finger extend down to a level of the corresponding collector in the base/collector mesa stripe, so that it overlaps onto a collector layer, and
wherein the emitter metallization is connected to the set of emitter stripes, and separated from the base/collector mesa stripe by a low-k dielectric material.

13. The HBT amplifier device of claim 12, wherein the extended portions of the emitter metallization provide an increased area of metal contact between the common conductive pillar and the emitter metallization.

14. A heterojunction bipolar transistor (HBT) amplifier device, comprising:
a plurality of transistor fingers arranged in parallel on a substrate, each transistor finger comprising:
a base/collector mesa stripe having a trapezoidal shaped cross-section with sloping sides, the base/collector mesa comprising a base stacked on a collector of the transistor finger;
a set of emitter mesa stripes arranged on the base/collector mesa stripe; and
emitter metallization formed over the set of emitter mesa stripes and the base/collector mesa stripe, the emitter metallization comprising (i) a center portion for providing electrical and thermal connectivity to the set of emitter mesa stripes and (ii) extended portions extending beyond the base and overlapping onto the sloping sides of the base/collector mesa stripe for increasing thermal coupling to the collector; and
a common conductive pillar formed over the plurality of transistor fingers for providing electrical and thermal conductivity; and
a plurality of stacked first-level interconnect layers formed over the substrate, each stacked first-level interconnect layer being connected to the collector of one of the plurality of transistor fingers via a subcollector.

15. A flip chip radio frequency (RF) power transistor device, comprising:
a substrate;
a plurality of transistor fingers arranged in parallel on the substrate, wherein each transistor finger comprises:
a base/collector mesa stripe having a trapezoidal shaped cross-section with sloping sides, the base/collector mesa stripe comprising a base layer stacked on a collector layer;
a plurality of emitter mesa stripes on the base layer of the base/collector mesa stripe; and
emitter metallization formed over the plurality of emitter mesa stripes and the base/collector mesa stripe, the emitter metallization comprising extended portions overlapping onto the sloping sides of the base/collector mesa stripe to the collector layer, the extended portions increasing thermal coupling to the collector layer;
a plated level interconnect formed over the emitter metallization and a planarization dielectric material;
a common conductive pillar formed on the plated level interconnect; and a plurality of thermal shunts formed on the substrate between adjacent transistor fingers of the plurality of transistor fingers, the plurality of thermal shunts being electrically isolated from the plurality of transistor fingers, wherein the plurality of thermal shunts enhance thermal conductivity from the collector layer to the common conductive pillar and provide mechanical anchors between the common conductive pillar and the substrate.

16. A heterojunction bipolar transistor (HBT) amplifier device, comprising:

a plurality of transistor fingers arranged in parallel on a substrate, each transistor finger comprising:

a base/collector mesa stripe shaving a trapezoidal shaped cross-section with sloping sides, the base/collector mesa stripe comprising a base stacked on a collector of the transistor finger;

a set of emitter mesa stripes arranged on the base/collector mesa stripe; and emitter metallization formed over the set of emitter mesa stripes;

a common conductive pillar formed over the plurality of transistor fingers for providing electrical and thermal conductivity; and a plurality of thermal shunts disposed on the substrate between adjacent transistor fingers of the plurality of transistor fingers, the plurality of thermal shunts being electrically isolated from the plurality of transistor fingers, and arranged to provide a corresponding plurality of thermal paths from each of the plurality of transistor fingers to the common conductive pillar.

17. The HBT amplifier device of claim 16, wherein the emitter metallization formed over the set of emitter mesa stripes comprises (i) a center portion for providing electrical and thermal connectivity to the set of emitter mesa stripes, and (ii) extended portions extending beyond the base and overlapping onto the sloping sides of the base/collector mesa stripe for increasing thermal coupling to the collector.

18. The HBT amplifier device of claim 16, wherein the plurality of thermal shunts are further configured to provide mechanical anchors between the common conductive pillar and the substrate.

19. The HBT amplifier device of claim 16, wherein the plurality of thermal shunts are formed on a corresponding plurality of isolation implant regions of the substrate.

20. The HBT amplifier device of claim 19, wherein each of the isolation implant regions is implanted with material that renders a corresponding portion of the substrate highly electrically resistive, while providing low thermal resistance.

* * * * *